(12) United States Patent
Kang et al.

(10) Patent No.: US 12,375,179 B2
(45) Date of Patent: Jul. 29, 2025

(54) OPTICAL TRANSCEIVER FOR HIGH-PRECISION BONDING OF FLEXIBLE PRINTED CIRCUIT BOARD AND CERAMIC FEED-THROUGH STRUCTURE AND PACKAGE STRUCTURE

(71) Applicant: Electronics and Telecommunications Research Institute, Daejeon (KR)

(72) Inventors: Eun Kyu Kang, Daejeon (KR); Jong Jin Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 298 days.

(21) Appl. No.: 18/328,845

(22) Filed: Jun. 5, 2023

(65) Prior Publication Data

US 2024/0106540 A1 Mar. 28, 2024

(30) Foreign Application Priority Data

Sep. 26, 2022 (KR) .......................... 10-2022-0121569

(51) Int. Cl.
*H04B 10/00* (2013.01)
*H04B 10/40* (2013.01)
*H05K 1/11* (2006.01)

(52) U.S. Cl.
CPC ............. *H04B 10/40* (2013.01); *H05K 1/118* (2013.01); *H05K 2201/10121* (2013.01)

(58) Field of Classification Search
CPC .................. H04B 10/40; H05K 1/118; H05K 2201/10121; H05K 1/189; G02B 6/4281; G02B 6/4246; G02B 6/4278
See application file for complete search history.

(56) References Cited

U.S. PATENT DOCUMENTS 9,400,359 B1 * 7/2016 Fu ........................... G02B 6/428
11,817,676 B2 * 11/2023 Nagarajan ........... H01S 5/02253
(Continued)

FOREIGN PATENT DOCUMENTS

| CN | 108540230 B | 3/2023 |
| KR | 10-1003198 B1 | 12/2010 |

(Continued)

OTHER PUBLICATIONS

Schott AG, "High and Low Temperature Cofired Multilayer Ceramics (HTCC and LTCC)", *Via Electronic*, Aug. 22, 2018.

(Continued)

*Primary Examiner* — Agustin Bello
(74) *Attorney, Agent, or Firm* — NSIP Law

(57) ABSTRACT

An optical transceiver is provided. A transceiver optical sub-assembly included in the optical transceiver includes a package body, accommodating optical devices and including a front surface coupled to an optical signal terminal, and a feed-through structure closing a rear surface of the package body and an open portion provided at both side surfaces adjacent to the rear surface. A disposition portion where one end of a flexible printed circuit board (FPCB) is disposed is provided at a front surface of the feed-through structure. Feed-through electrodes bonded to FPCB electrodes provided at the one end of the FPCB are provided on a surface of the disposition portion. For precise alignment of the FPCB electrodes and the feed-through electrodes, a protrusion portion is provided at the one end of the FPCB, and an insertion groove into which the protrusion portion is inserted is formed in a front surface of the feed-through structure.

17 Claims, 10 Drawing Sheets

(56) References Cited

U.S. PATENT DOCUMENTS

| | | | |
|---|---|---|---|
| 2007/0218712 A1* | 9/2007 | Guja | G02B 6/4281 439/67 |
| 2011/0008056 A1* | 1/2011 | Yagisawa | H05K 1/147 174/254 |
| 2012/0087136 A1* | 4/2012 | Kuwahara | H05K 1/118 361/679.01 |
| 2013/0001410 A1* | 1/2013 | Zhao | H05K 1/115 174/262 |
| 2013/0279862 A1* | 10/2013 | Ishii | G02B 6/4269 385/88 |
| 2014/0147128 A1 | 5/2014 | Han et al. | |
| 2016/0191166 A1* | 6/2016 | Wang | G02B 6/42 398/135 |
| 2016/0286657 A1* | 9/2016 | Ban | H05K 3/363 |
| 2017/0048015 A1* | 2/2017 | O'Daniel | H04B 10/506 |
| 2017/0269315 A1* | 9/2017 | Yeh | G02B 6/4274 |
| 2018/0287705 A1* | 10/2018 | Lin | G02B 6/12004 |
| 2019/0025517 A1 | 1/2019 | Kwon et al. | |
| 2019/0052049 A1* | 2/2019 | Sato | H01S 5/4012 |
| 2019/0238236 A1* | 8/2019 | Mii | G02B 6/4248 |
| 2019/0346640 A1* | 11/2019 | Xie | G02B 6/4256 |
| 2020/0116961 A1* | 4/2020 | Ding | G02B 6/4256 |
| 2021/0247576 A1* | 8/2021 | Oomori | G02B 6/2938 |
| 2022/0337022 A1* | 10/2022 | Zhang | H01S 5/0239 |
| 2022/0404563 A1* | 12/2022 | Liu | H01S 5/0233 |
| 2022/0416901 A1* | 12/2022 | Yoshimura | H04B 10/501 |
| 2023/0061382 A1* | 3/2023 | Kang | G02B 6/4279 |
| 2023/0228955 A1* | 7/2023 | Zhang | G02B 6/4292 385/93 |
| 2023/0228957 A1* | 7/2023 | Shao | G02B 6/4238 385/92 |
| 2023/0258883 A1* | 8/2023 | Zhang | G02B 6/4284 385/15 |
| 2024/0106540 A1* | 3/2024 | Kang | H05K 1/118 |
| 2024/0427096 A1* | 12/2024 | Minami | G02B 6/4228 |
| 2025/0076601 A1* | 3/2025 | Kwon | G02B 6/428 |

FOREIGN PATENT DOCUMENTS

| | | |
|---|---|---|
| KR | 10-2015-0030098 A | 3/2015 |
| KR | 10-1513873 B1 | 4/2015 |
| KR | 10-2129953 B1 | 8/2020 |

OTHER PUBLICATIONS

Ken McGillivray, "High Temperature Cofired Ceramic (HTCC) Package Design and Applications" *AMETEK*, May 6, 2014.

Myeong Yeol, Lee, "Htcc Technology", Ceramist No. 15-1, Feb. 2012.

\* cited by examiner

OPTICAL TRANSCEIVER FOR HIGH-PRECISION BONDING OF FLEXIBLE PRINTED CIRCUIT BOARD AND CERAMIC FEED-THROUGH STRUCTURE AND PACKAGE STRUCTURE

CROSS-REFERENCE TO RELATED APPLICATIONS

This application claims the benefit of the Korean Patent Application No. 10-2022-0121569 filed on Sep. 26, 2022, which is hereby incorporated by reference as if fully set forth herein.

BACKGROUND

Field of the Invention

The present invention relates to an optical transceiver used in an optical communication network, and more particularly, to high-precision bonding technology between a flexible printed circuit board (FPCB) electrode of an FPCB and a feed-through electrode of a feed-through structure applied to a transceiver optical sub-assembly included in an optical transceiver.

Discussion of the Related Art

FIG. 1 is a diagram illustrating a total structure of a transceiver optical sub-assembly to which an FPCB of the related art is applied.

Recently, as data traffic of 5G and data center network increases rapidly, the market demand for optical transceivers capable of high speed transmission of massive data is rapidly increasing. Referring to FIG. 1, an optical transceiver of the related art includes a transmitter optical sub-assembly (TOSA) 10, a receiver optical sub-assembly (ROSA) 20, an electrical sub-assembly (ESA) 30, and an FPCB 40 which electrically connects the TOSA 10 and the ROSA 20 with the ESA 30.

The ESA 30 includes a printed circuit board (PCB) 31 and electronic devices 33 which are mounted on the PCB 31 and process signals. An electric signal terminal 35 is provided on one end of the PCB 31, and a terminal (not shown) electrically connected with one end of the FPCB 40 is provided on an opposite end of the PCB 31.

The TOSA 10 and the ROSA 20 are implemented as a package 21 having a hexahedral shape. An optical signal terminal 11 is provided on a front surface of each of the TOSA 10 and the ROSA 20. A stack type feed-through 40 is provided on a rear surface of each of the TOSA 10 and the ROSA 20, and a stack type ceramic feed-through 50 is electrically connected with one end of the FPCB 40. Accordingly, the TOSA 10 and the ROSA 20 may be electrically connected with the ESA 30 through the FPCB 40 and the stack type ceramic feed-through 50.

Recently, as the demand for optical transceivers of 100 Gbps per channel which is higher than 25 Gbps per channel increases, it is required to highly increase a speed of transceiver optical sub-assemblies, and the advancement of technology for extending a high frequency signal bandwidth of a high speed signal line is needed.

Particularly, a frequency response characteristic is reduced due to the impedance mismatch of high speed signal lines. In an example of FIG. 1, bonding precision between electrodes at a contact point of the FPCB 40 and the ESA 30 and bonding precision between electrodes at a contact point of the FPCB 40 and the ceramic feed-through 50 are the main causes of an impedance mismatch.

For accurate impedance matching, an electrode of the ceramic feed-through 50, an electrode of the FPCB 40, and an electrode of the ESA 30 should be accurately aligned at each contact point. To this end, in the related art, separate process equipment for bonding the electrode of the FPCB 40 to the electrode of the ceramic feed-through 50 is used, or a manual operation depends on a skill level of a worker, and due to this, there are drawbacks in terms of time, cost, and personnel.

SUMMARY

An aspect of the present invention is directed to providing an optical transceiver in which alignment precision between electrodes increases in a bonding process between an FPCB electrode of an FPCB and a feed-through electrode of a stack type ceramic feed-through assembled with a transceiver optical sub-assembly implemented as a package, thereby improving an impedance mismatch.

To achieve these and other advantages and in accordance with the purpose of the invention, as embodied and broadly described herein, there is provided an optical transceiver including a transceiver optical sub-assembly, an electrical sub-assembly, and a flexible printed circuit board (FPCB) electrically connecting the transceiver optical sub-assembly with the electrical sub-assembly, the transceiver optical sub-assembly including a package body, accommodating optical devices and including a front surface coupled to an optical signal terminal, and a feed-through structure closing a rear surface of the package body and an open portion provided at both side surfaces adjacent to the rear surface, wherein a disposition portion where one end of the FPCB is disposed is provided at a front surface of the feed-through structure, and feed-through electrodes bonded to FPCB electrodes provided at the one end of the FPCB are provided on a surface of the disposition portion, and for precise alignment of the FPCB electrodes and the feed-through electrodes, a protrusion portion is provided at the one end of the FPCB, and an insertion groove into which the protrusion portion is inserted is formed in a front surface of the feed-through structure.

In an embodiment, the protrusion portion may protrude from the one end of the FPCB to a forward region with respect to the FPCB electrodes.

In an embodiment, the protrusion portion may have a horizontal length, extending in a direction in which the FPCB electrodes are arranged, and a vertical length which is shorter than the horizontal length.

In an embodiment, the vertical length may correspond to a depth of the insertion groove.

In an embodiment, the insertion groove may have a length corresponding to the horizontal length and a depth corresponding to the vertical length.

In an embodiment, the protrusion portion may include two protrusion portions protruding from the one end of the FPCB with the FPCB electrodes therebetween.

In an embodiment, the insertion groove may include two insertion grooves into which the two protrusion portions are respectively inserted.

In an embodiment, the two protrusion portions may have a wedge shape where an end is sharp.

In another aspect of the present invention, there is provided an optical transceiver including a transceiver optical sub-assembly, an electrical sub-assembly, and a flexible printed circuit board (FPCB) electrically connecting the transceiver optical sub-assembly with the electrical subassembly, the transceiver optical sub-assembly including a package body, accommodating optical devices and including a front surface coupled to an optical signal terminal, and a feed-through structure closing a rear surface of the package body and an open portion provided at both side surfaces adjacent to the rear surface, wherein a disposition portion where one end of the FPCB is disposed is provided at a front surface of the feed-through structure, and feed-through electrodes bonded to FPCB electrodes provided at the one end of the FPCB are provided on a surface of the disposition portion, and for precise alignment of the FPCB electrodes and the feed-through electrodes, a guide groove into which the FPCB is inserted is formed in both ends of the disposition portion.

In an embodiment, the guide groove may be a groove into which a side end of the FPCB is inserted by using a sliding type.

In an embodiment, the guide groove may have a cross-sectional structure having a U-shape.

In an embodiment, the transceiver optical sub-assembly may include a transmitter optical sub-assembly (TOSA) or a receiver optical sub-assembly (ROSA).

In an embodiment, an internal disposition portion may be provided at an inner surface of the feed-through structure corresponding to the front surface of the feed-through structure, and internal feed-through electrodes provided as one body with the feed-through electrodes may be provided on a surface of the internal disposition portion.

In an embodiment, the internal feed-through electrodes may be electrically connected with the optical devices by a wire.

In another aspect of the present invention, there is provided a package structure including: a package body accommodating optical devices and including a front surface coupled to an optical signal terminal; and a feed-through structure closing a rear surface of the package body and an open portion provided at both side surfaces adjacent to the rear surface, wherein a disposition portion where one end of a flexible printed circuit board (FPCB) is disposed is provided at a front surface of the feed-through structure, and feed-through electrodes bonded to FPCB electrodes provided at the one end of the FPCB are provided on a surface of the disposition portion, and for precise alignment of the FPCB electrodes and the feed-through electrodes, a protrusion portion is provided at the one end of the FPCB, and an insertion groove into which the protrusion portion is inserted is formed in a front surface of the feed-through structure.

In an embodiment, the protrusion portion may include two protrusion portions protruding from the one end of the FPCB with the FPCB electrodes therebetween.

In an embodiment, the insertion groove may include two insertion grooves into which the two protrusion portions are respectively inserted.

It is to be understood that both the foregoing general description and the following detailed description of the present invention are exemplary and explanatory and are intended to provide further explanation of the invention as claimed.

DETAILED DESCRIPTION OF THE INVENTION

In the following description, the technical terms are used only for explain a specific exemplary embodiment while not limiting the present invention. The terms of a singular form may include plural forms unless referred to the contrary. The meaning of 'comprise', 'include', or 'have' specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be described in detail with reference to the accompanying drawings. In describing the invention, to facilitate the entire understanding of the invention, like numbers refer to like elements throughout the description of the figures, and a repetitive description on the same element is not provided.

Figure 1:
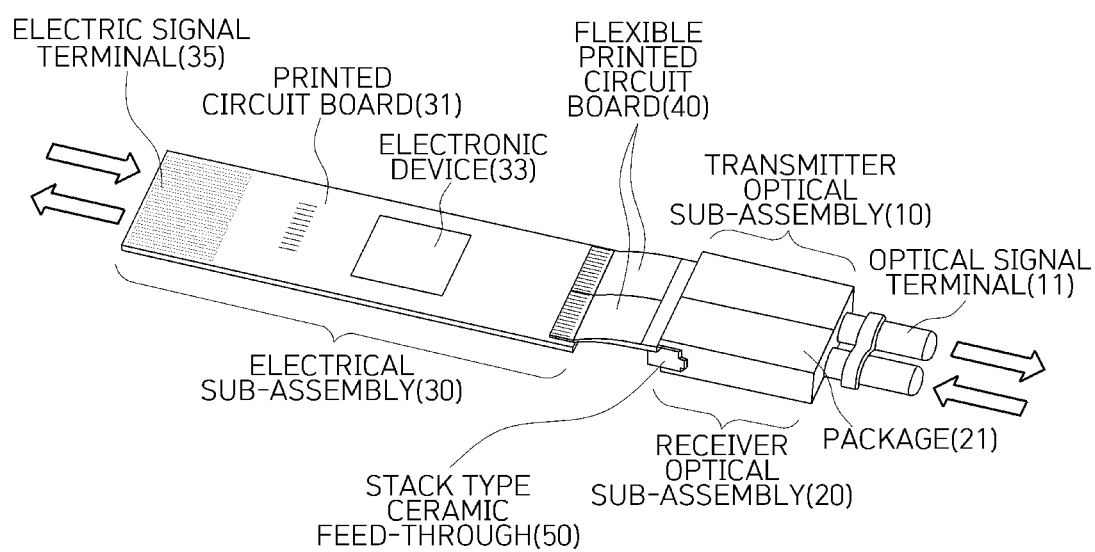
FIG. 1 is a diagram illustrating a total structure of a transceiver optical sub-assembly to which an FPCB of the related art is applied.
Figure 2:
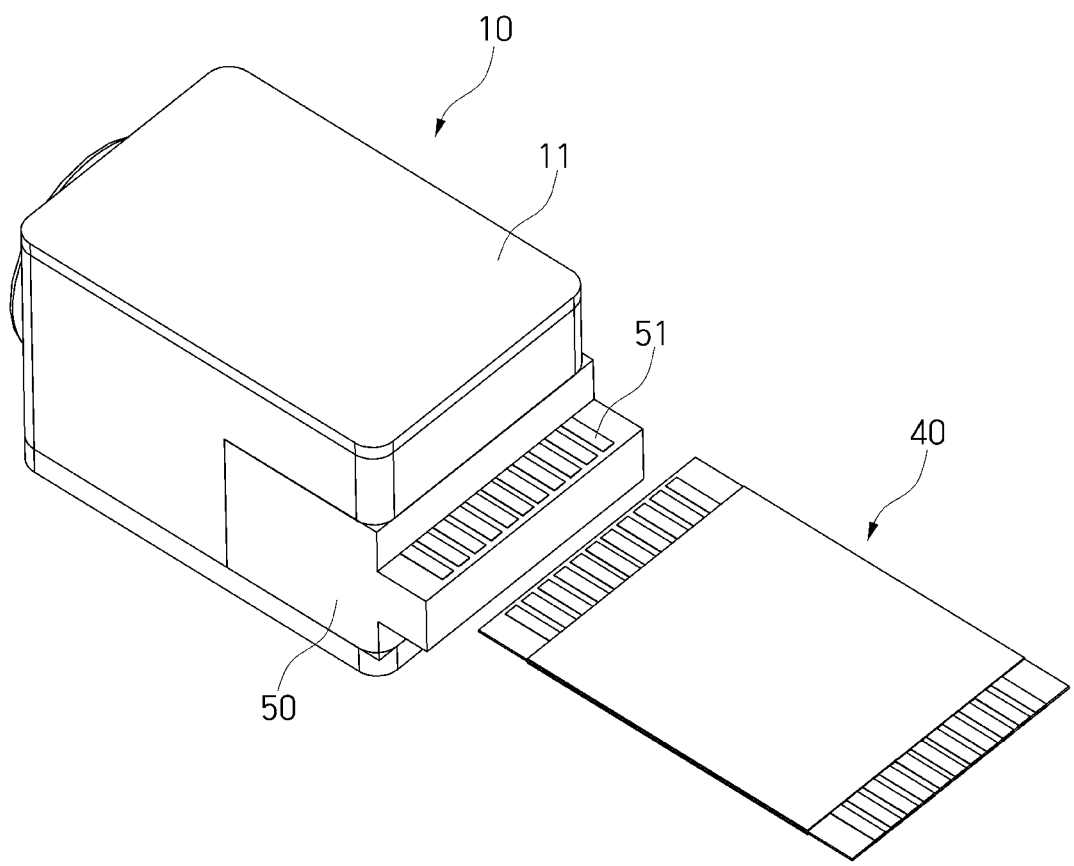
FIGS. 2 to 4 are diagrams for describing an external appearance and an internal structure of the transceiver optical sub-assembly illustrated in FIG. 1.
Figure 3:
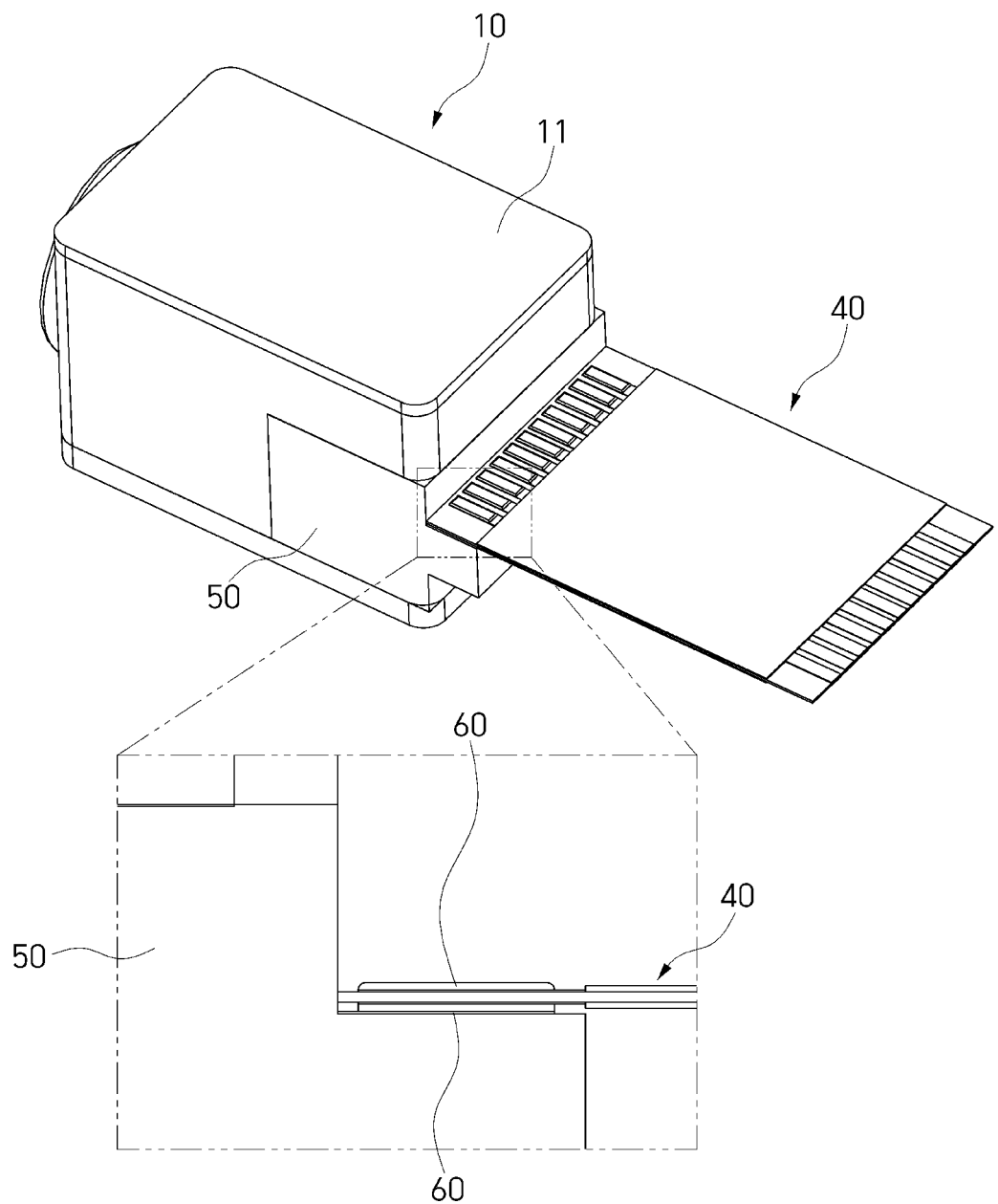
Figure 4:
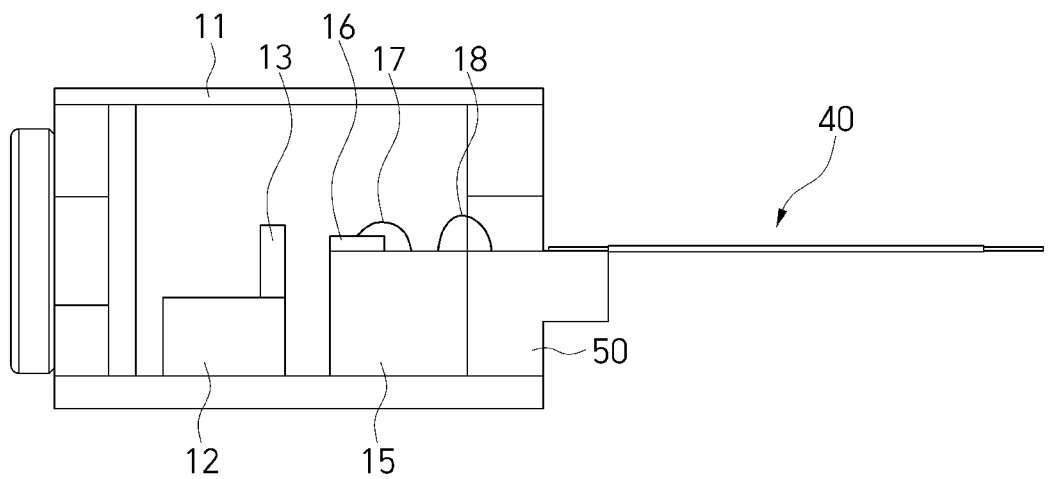

FIGS. 2 to 4 are diagrams for describing an external appearance and an internal structure of the transceiver optical sub-assembly illustrated in FIG. 1. FIG. 2 illustrates a state where a transmitter optical sub-assembly 10 is de-bonded from an FPCB 40, FIG. 3 illustrates a state where the transmitter optical sub-assembly 10 is bonded to the FPCB 40, and FIG. 4 illustrates an internal structure of the transmitter optical sub-assembly 10.

In FIGS. 2 to 4, an external appearance and an internal structure of the transmitter optical sub-assembly 10 are illustrated, but a receiver optical sub-assembly 20 may have an external appearance and an internal structure similar thereto. Accordingly, a description of the receiver optical sub-assembly 20 may be replaced with a description of the transmitter optical sub-assembly 10.

As illustrated in FIGS. 2 to 4, the transmitter optical sub-assembly 10 may include a package body 11 having a hexahedral shape and may be implemented as a package having a hexahedral shape. In detail, the transmitter optical sub-assembly 10 may include the package body 11 having a hexahedral shape, and the package body 11 may protect the elements from physical, chemical, and electrical external effects so as to secure the performance and reliability of elements accommodated therein.

The elements accommodated into the package body 11, as illustrated in FIG. 4, may include a first sub-mount 12 disposed on an internal bottom of the package body 11, a lens 13 mounted on the first sub-mount 12, a second sub-mount 15 disposed on the internal bottom of the package body 11, and an optical device 16 and wires 17 and 18 mounted on the second sub-mount 15.

The optical device 16 may be electrically connected with an electrode (51 of FIG. 2) of a stack type ceramic feed-through structure 50 by the wires 17 and 18. That is, an electric signal transferred through the stack type ceramic feed-through structure 50 may be transferred to an optical source device (for example, a laser diode) accommodated into the package body 11 and an optical device (16 of FIG. 4) such as a light receiving device (for example, a photo-diode).

The stack type ceramic feed-through structure 50 based on a high temperature co-fired ceramic (HTCC) process may be provided on a front surface of the package body 11 and may be electrically connected with an electrical sub-assembly (30 of FIG. 1) through the FPCB 40.

The transmitter optical sub-assembly (10 of FIG. 1) and the electrical sub-assembly (30 of FIG. 1) may be respectively connected with an electrode of the electrical sub-assembly (30 of FIG. 1) and the electrode (51 of FIG. 2) of the ceramic feed-through structure through electrodes provided at both ends of the FPCB 40, based on welding (60 of FIG. 3).

The present invention relates to a stack type ceramic feed-through structure based on an HTCC process, in which a feed-through electrode of a stack type ceramic feed-through and an FPCB electrode of an FPCB, used for a high speed signal connection between the outside and the inside of a package of a high speed transceiver optical sub-assembly used in an optical communication network, may be manually aligned and then may be welded.

Moreover, the present invention may propose a structural feature of a ceramic feed-through structure in which an FPCB electrode and a feed-through electrode may be automatically aligned, and in one structural feature, a ceramic feed-through structure may include a guide groove or an insertion groove into which an end of an FPCB is inserted.

Because an end of the FPCB is inserted into the insertion groove or the guide groove, the FPCB electrode and the feed-through electrode of the stack type ceramic feed-through structure may be automatically aligned, and thus, the feed-through electrode of the stack type ceramic feed-through structure and the FPCB electrode of the FPCB may be precisely aligned and a welding process time may be reduced.

Hereinafter, embodiments of a ceramic feed-through structure for high-precision bonding between an electrode of an FPCB and an electrode of a ceramic feed-through structure will be described in detail.

First Embodiment

Figure 5:
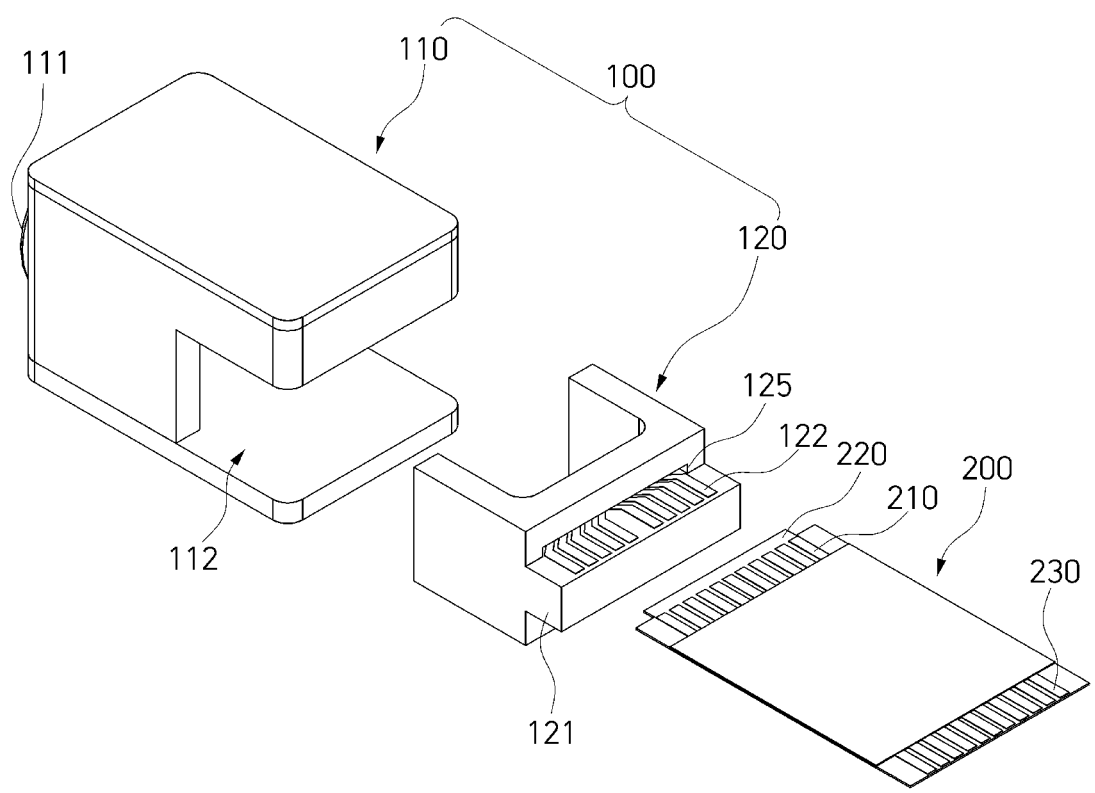
FIG. 5 is an exploded perspective view of a transmitter optical sub-assembly for describing a structure of a feed-through structure according to a first embodiment of the present invention.
Figure 6:
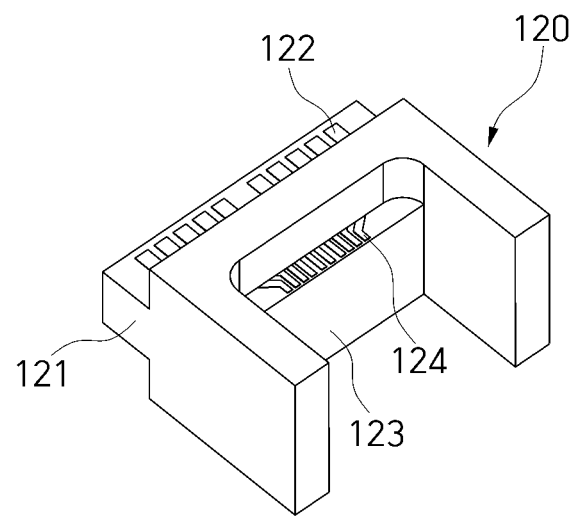
FIG. 6 is a rear perspective view of the feed-through structure illustrated in FIG. 5.
Figure 7:
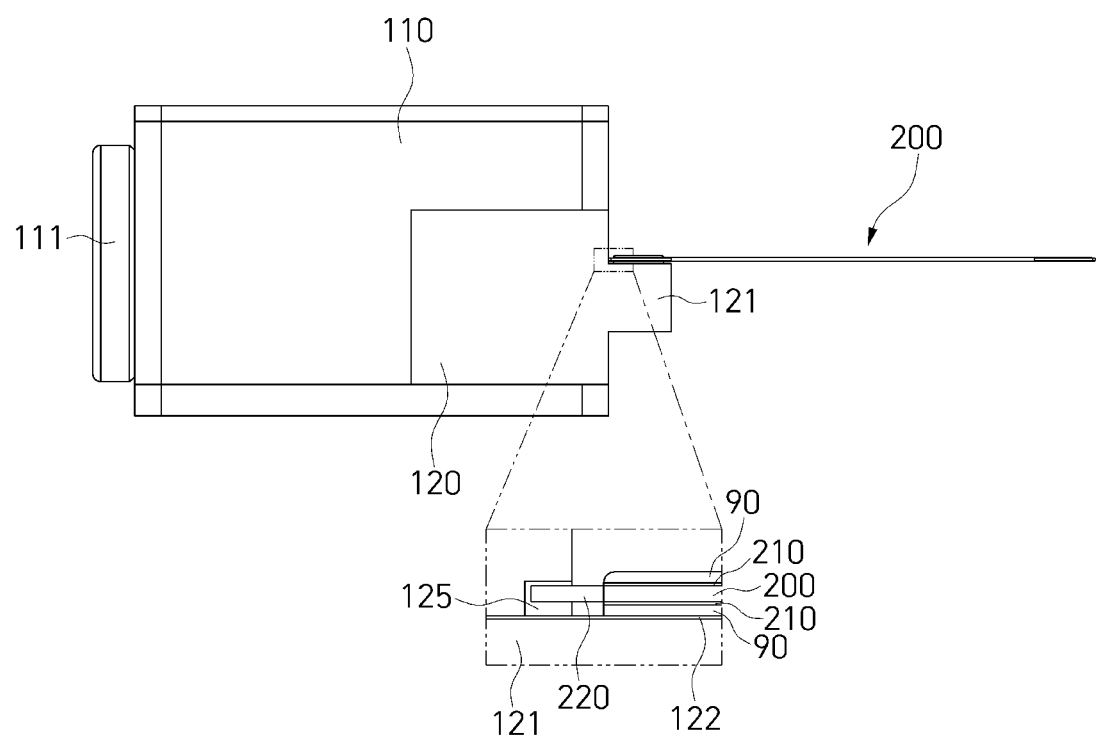
FIGS. 7 and 8 are diagrams illustrating an example where a protrusion portion of an FPCB is inserted into an insertion groove formed in a ceramic feed-through structure in a state where a ceramic feed-through structure and a package body illustrated in FIG. 5 are coupled to each other.
Figure 8:
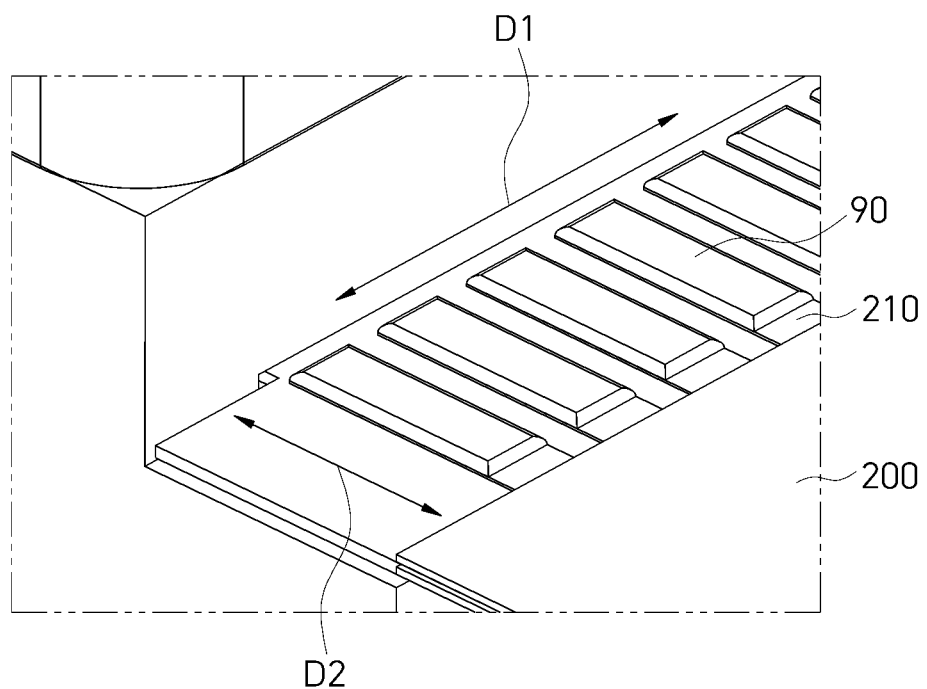

FIG. 5 is an exploded perspective view of a transmitter optical sub-assembly for describing a structure of a feed-through structure according to a first embodiment of the present invention. FIG. 6 is a rear perspective view of the feed-through structure illustrated in FIG. 5. FIGS. 7 and 8 are diagrams illustrating an example where a protrusion portion of an FPCB is inserted into an insertion groove formed in a ceramic feed-through structure in a state where a ceramic feed-through structure and a package body illustrated in FIG. 5 are coupled to each other.

Referring to FIG. 5, a transmitter optical sub-assembly 100 may be a receiver optical sub-assembly. The transmitter optical sub-assembly 100 may include a package body 110 and a ceramic feed-through structure 120.

A coupling portion coupled to an optical signal terminal (11 of FIG. 1) may be provided on a front surface of a package body 110. An open portion 112 externally exposing an inner portion of the package body 110 may be provided at a rear surface of the package body 110 and a portion of each of both side surfaces adjacent to the rear surface.

A ceramic feed-through structure 120 may be inserted into and coupled to the open portion 112 and may close the open portion 112. When seen from above, a shape of the ceramic feed-through structure 120 may be formed as a 'U'-shape to cover the open portion 112 of the package body 110.

An external disposition portion 121 where one end of an FPCB 220 is disposed may be provided in a front surface of the ceramic feed-through structure 120. The external disposition portion 121 may protrude in a direction vertical to the front surface of the ceramic feed-through structure 120.

FPCB electrodes 210 provided at one end of the FPCB 200 and external feed-through electrodes 122 electrically bonded thereto by a soldering process may be provided on an upper surface of the external disposition portion 121. Although not shown in FIG. 5, FPCB electrodes 230 provided at the other end of the FPCB 200 may be electrically connected with the electrical sub-assembly 30 of FIG.

An internal disposition portion 123, as illustrated in FIG. 6, may be provided on an inner surface, corresponding to the front surface, of the ceramic feed-through structure 120. The internal disposition portion 123 may protrude in a direction vertical to the inner surface of the ceramic feed-through structure 120.

Internal feed-through electrodes 124 bonded to one end of the wire 18 of FIG. 4 may be provided on an upper surface of the internal disposition portion 123. In this case, the external feed-through electrodes 122 provided on the external disposition portion 121 and the internal feed-through electrodes 124 provided on an upper surface of the internal disposition portion 123 may be provided as one body.

According to the first embodiment of the present invention, the external feed-through electrodes 122 of the ceramic feed-through structure 120 and the FPCB electrodes 210 of the FPCB 200 may be bonded to one another in a precisely aligned state.

To this end, a protrusion portion 220 may be provided at one end of the FPCB 200 where the FPCB electrodes 210 are provided, and an insertion groove 125 into which the protrusion portion 220 is inserted may be formed in the front surface of the ceramic feed-through structure 120.

As illustrated in FIGS. 5 and 7, the protrusion portion 220 may protrude from one end of the FPCB 200 to a forward region with respect to the FPCB electrodes 210 and may have a rectangular shape where a horizontal length is greater than a vertical length. Here, the vertical length may be a length which extends in a direction in which the protrusion portion 220 is inserted into the insertion groove 125, and the horizontal length may be a length which extends in a direction in which the FPCB electrodes 210 are arranged.

The horizontal length of the protrusion portion 220 may be set to be slightly greater or less than or equal to a length by which the FPCB electrodes 210 are arranged.

The insertion groove 125 may correspond to each of the horizontal length and the vertical length of the protrusion portion 220 and may be designed so that an overlap area between the FPCB electrode 210 of the FPCB 200 and the external feed-through electrodes 122 of the ceramic feed-through structure 120 is largest in a state where the protrusion portion 220 is sufficiently inserted into the insertion groove 125.

When the protrusion portion 220 of the FPCB 200 is sufficiently inserted into the insertion groove 125 of the ceramic feed-through structure 120, the horizontal and vertical-direction movement of the FPCB 200 may be limited in a state where the overlap area between the FPCB electrode 210 and the external feed-through electrodes 122 is largest, and thus, as illustrated in FIG. 8, the FPCB electrodes 210 and the external feed-through electrodes 122 may be precisely aligned in a horizontal direction D1 and a vertical direction D2.

Furthermore, in FIGS. 7 and 8, reference numeral 90 may represent a solder, and in FIG. 8, because the FPCB electrodes 210 are bonded to the external feed-through electrodes 122 by a solder 90, the external feed-through electrodes 122 are occluded by the FPCB electrodes 210 disposed thereon and are not illustrated.

Second Embodiment

Figure 9:
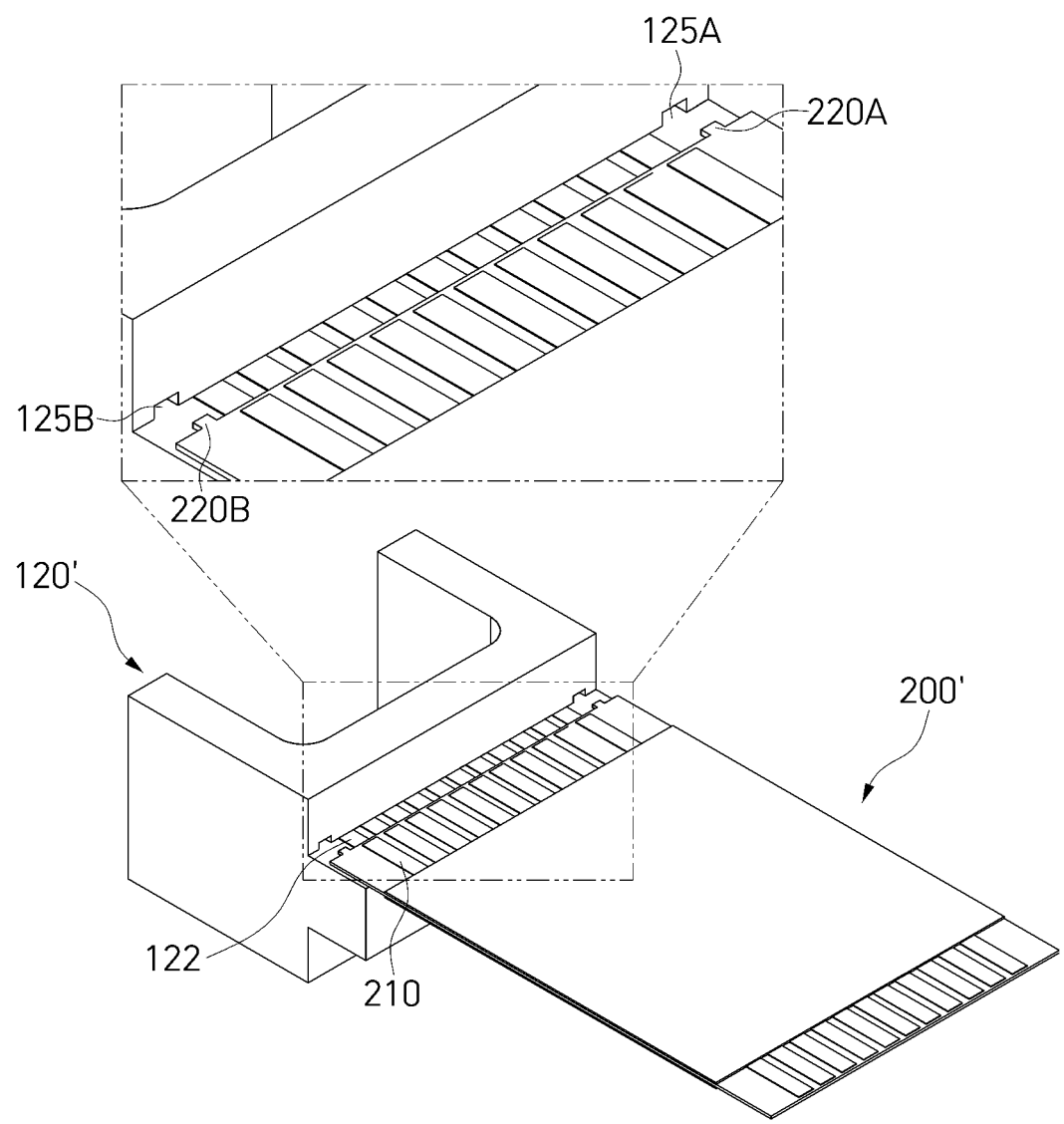
FIG. 9 is a diagram for describing a structure of a feed-through structure according to a second embodiment of the present invention.

FIG. 9 is a diagram for describing a structure of a feed-through structure according to a second embodiment of the present invention and for conciseness of illustration, the package body 110 illustrated in FIG. 5 is not illustrated.

Referring to FIG. 9, two protrusion portions 220A and 220B may be provided at one end of an FPCB 200' according to the second embodiment of the present invention with FPCB electrodes 210 therebetween, and thus, may have a difference with the protrusion portion 220 provided in the FPCB 200 according to the first embodiment of the present invention described above.

Moreover, two insertion grooves 125A and 125B into which the two protrusion portions 220A and 220B are respectively inserted may be provided in a front surface of a feed-through structure 120' according to the second embodiment of the present invention, and thus, the feed-through structure 120' according to the second embodiment of the present invention may have a difference with the feed-through structure 120 according to the first embodiment of the present invention where one insertion groove 125 is provided in the front surface thereof.

In FIG. 9, an example where the two protrusion portions 220A and 220B are formed in a tetragonal shape is illustrated, but the present invention is not limited thereto and the two protrusion portions 220A and 220B may be formed in a wedge shape where an end is sharp. When the two protrusion portions 220A and 220B are formed in a wedge shape, the two insertion grooves 125A and 125B formed in the front surface of the feed-through structure 120' may be formed in a wedge shape where a width of a groove is narrowed based on a depth.

According to the second embodiment, the two protrusion portions 220A and 220B provided at the one end of the FPCB 200' may be respectively inserted into the two insertion grooves 125A and 125B formed in the front surface of the feed-through structure 120', and thus, it may be easily understood by those skilled in the art that the same effect as the first embodiment is obtained.

Third Embodiment

Figure 10:
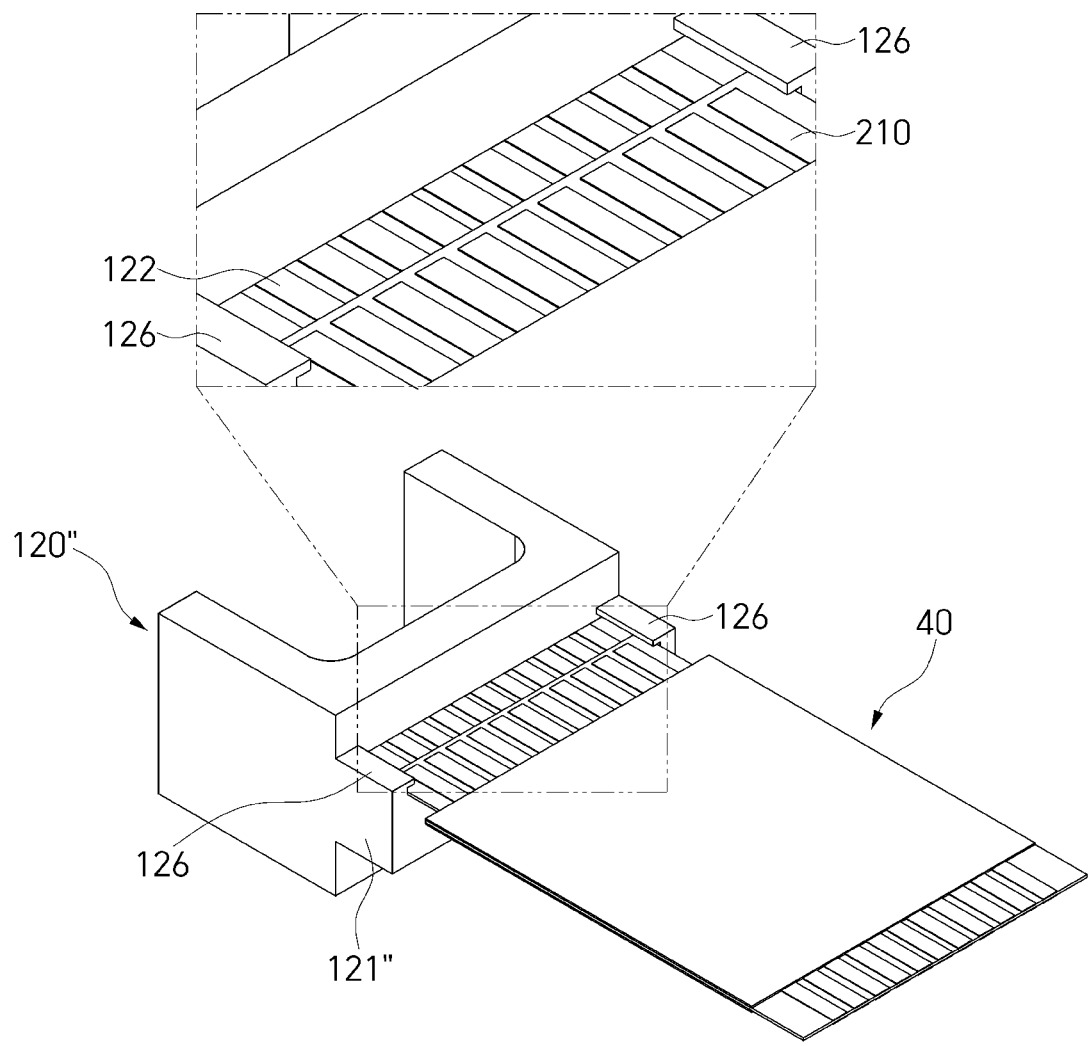
FIG. 10 is a diagram for describing a structure of a feed-through structure according to a third embodiment of the present invention.

FIG. 10 is a diagram for describing a structure of a feed-through structure according to a third embodiment of the present invention and for conciseness of illustration, the package body 110 illustrated in FIG. 5 is not illustrated.

Referring to FIG. 10, in a feed-through structure 120" according to the third embodiment of the present invention, a guide groove 126 into which a side end of an FPCB 40 is inserted by using a sliding type may be formed in both ends of an external disposition portion 121", and thus, the third embodiment may have a difference with the first and second embodiments described above.

A cross-sectional surface of the guide groove 126 may be formed in a 'U'-shape, so that the side end of an FPCB 40 is inserted into the guide groove 126 by using the sliding type.

According to the third embodiment, the side end of the FPCB 40 may be inserted into the guide groove 126 formed in the both ends of the external disposition portion 121" of the feed-through structure 120" by using the sliding type, and thus, the same effect as the first and second embodiments may be obtained, namely, an effect may be obtained where an electrode 122 of the feed-through structure 120" and an FPCB electrode 210 of the FPCB 40 may be precisely aligned.

According to the embodiments of the present invention, because a guide groove or an insertion groove into which an FPCB is inserted is formed in a ceramic feed-through structure so as to improve an impedance mismatch in a bonding process between an electrode of an FPCB and an electrode of the ceramic feed-through structure assembled with a transceiver optical sub-assembly of a package type, alignment precision between the electrode of the FPCB and the electrode of the ceramic feed-through structure may increase without separate alignment equipment, and moreover, a high-precision bonding process between the electrode of the FPCB and the electrode of the ceramic feed-through structure may be performed, thereby improving the equipment investment cost and productivity.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An optical transceiver comprising a transceiver optical sub-assembly, an electrical sub-assembly, and a flexible printed circuit board (FPCB) electrically connecting the transceiver optical sub-assembly with the electrical sub-assembly, the transceiver optical sub-assembly comprising a package body, accommodating optical devices and including a front surface coupled to an optical signal terminal, and a feed-through structure closing a rear surface of the package body and an open portion provided at both side surfaces adjacent to the rear surface,
   wherein a disposition portion where one end of the FPCB is disposed is provided at a front surface of the feed-through structure, and feed-through electrodes bonded to FPCB electrodes provided at the one end of the FPCB are provided on a surface of the disposition portion, and
   for precise alignment of the FPCB electrodes and the feed-through electrodes, a protrusion portion is provided at the one end of the FPCB, and an insertion groove into which the protrusion portion is inserted is formed in a front surface of the feed-through structure.

2. The optical transceiver of claim 1, wherein the protrusion portion protrudes from the one end of the FPCB to a forward region with respect to the FPCB electrodes.

3. The optical transceiver of claim 1, wherein the protrusion portion has a horizontal length, extending in a direction in which the FPCB electrodes are arranged, and a vertical length which is shorter than the horizontal length.

4. The optical transceiver of claim 3, wherein the vertical length corresponds to a depth of the insertion groove.

5. The optical transceiver of claim 3, wherein the insertion groove has a length corresponding to the horizontal length and a depth corresponding to the vertical length.

6. The optical transceiver of claim 1, wherein the protrusion portion comprises two protrusion portions protruding from the one end of the FPCB with the FPCB electrodes therebetween.

7. The optical transceiver of claim 6, wherein the insertion groove comprises two insertion grooves into which the two protrusion portions are respectively inserted.

8. The optical transceiver of claim 6, wherein the two protrusion portions have a wedge shape where an end is sharp.

9. An optical transceiver comprising a transceiver optical sub-assembly, an electrical sub-assembly, and a flexible printed circuit board (FPCB) electrically connecting the transceiver optical sub-assembly with the electrical sub-assembly, the transceiver optical sub-assembly comprising a package body, accommodating optical devices and including a front surface coupled to an optical signal terminal, and a feed-through structure closing a rear surface of the package body and an open portion provided at both side surfaces adjacent to the rear surface,
wherein a disposition portion where one end of the FPCB is disposed is provided at a front surface of the feed-through structure, and feed-through electrodes bonded to FPCB electrodes provided at the one end of the FPCB are provided on a surface of the disposition portion, and
for precise alignment of the FPCB electrodes and the feed-through electrodes, a guide groove into which the FPCB is inserted is formed in both ends of the disposition portion.

10. The optical transceiver of claim 9, wherein the guide groove is a groove into which a side end of the FPCB is inserted by using a sliding type.

11. The optical transceiver of claim 9, wherein the guide groove has a cross-sectional structure having a U-shape.

12. The optical transceiver of claim 9, wherein the transceiver optical sub-assembly comprises a transmitter optical sub-assembly (TOSA) or a receiver optical sub-assembly (ROSA).

13. The optical transceiver of claim 9, wherein an internal disposition portion is provided at an inner surface of the feed-through structure corresponding to the front surface of the feed-through structure, and
internal feed-through electrodes provided as one body with the feed-through electrodes are provided on a surface of the internal disposition portion.

14. The optical transceiver of claim 13, wherein the internal feed-through electrodes are electrically connected with the optical devices by a wire.

15. A package structure comprising:
a package body accommodating optical devices and including a front surface coupled to an optical signal terminal; and
a feed-through structure closing a rear surface of the package body and an open portion provided at both side surfaces adjacent to the rear surface,
wherein a disposition portion where one end of a flexible printed circuit board (FPCB) is disposed is provided at a front surface of the feed-through structure, and feed-through electrodes bonded to FPCB electrodes provided at the one end of the FPCB are provided on a surface of the disposition portion, and
for precise alignment of the FPCB electrodes and the feed-through electrodes, a protrusion portion is provided at the one end of the FPCB, and an insertion groove into which the protrusion portion is inserted is formed in a front surface of the feed-through structure.

16. The package structure of claim 15, wherein the protrusion portion comprises two protrusion portions protruding from the one end of the FPCB with the FPCB electrodes therebetween.

17. The package structure of claim 16, wherein the insertion groove comprises two insertion grooves into which the two protrusion portions are respectively inserted.

* * * * *